United States Patent
Morgenthaler

[11] Patent Number: 6,113,751
[45] Date of Patent: Sep. 5, 2000

[54] ELECTROMAGNETIC BEAM ASSISTED DEPOSITION METHOD FOR DEPOSITING A MATERIAL ON AN IRRADIATED SUBSTRATE

[75] Inventor: Daniel R. Morgenthaler, Littleton, Colo.

[73] Assignee: Lockheed Martin Corporation, Bethesda, Md.

[21] Appl. No.: 09/130,705

[22] Filed: Aug. 6, 1998

[51] Int. Cl.[7] .......................... C23C 14/34; C23C 14/04; C23C 14/28

[52] U.S. Cl. .................. 204/192.12; 204/192.1; 427/554; 427/596

[58] Field of Search .......................... 204/192.1, 192.11, 204/192.12, 298.01, 298.02, 298.04, 298.09; 427/586, 596, 554; 118/715; 219/121.68

[56] References Cited

U.S. PATENT DOCUMENTS

| | | | |
|---|---|---|---|
| 4,664,940 | 5/1987 | Bensoussan et al. | 427/53.1 |
| 4,799,454 | 1/1989 | Ito | 118/723 |
| 5,154,945 | 10/1992 | Baldwin et al. | 427/596 |
| 5,159,169 | 10/1992 | Nishikawa et al. | 219/121.6 |
| 5,248,659 | 9/1993 | Nagaishi et al. | 505/1 |
| 5,360,785 | 11/1994 | Yoshida et al. | 505/474 |
| 5,382,457 | 1/1995 | Coombe | 427/596 |
| 5,405,517 | 4/1995 | Lampkin | 204/192.12 |
| 5,406,906 | 4/1995 | Rimai et al. | 117/92 |
| 5,415,901 | 5/1995 | Tanaka et al. | 427/596 |
| 5,468,930 | 11/1995 | Nishikawa et al. | 219/121.6 |
| 5,499,599 | 3/1996 | Lowndes et al. | 117/50 |
| 5,558,788 | 9/1996 | Mashburn | 219/121.68 |
| 5,591,486 | 1/1997 | Okano et al. | 427/255.2 |
| 5,593,742 | 1/1997 | Lux et al. | 427/586 |
| 5,611,883 | 3/1997 | Tompkins et al. | 156/272.8 |
| 5,624,722 | 4/1997 | Nagaishi et al. | 427/586 |
| 5,650,378 | 7/1997 | Iijima et al. | 505/473 |
| 5,660,746 | 8/1997 | Witanachchi et al. | 219/121.66 |

FOREIGN PATENT DOCUMENTS 0190051  6/1986  European Pat. Off.  .......... 204/298.02

*Primary Examiner*—Nam Nguyen
*Assistant Examiner*—Gregg Cantelmo
*Attorney, Agent, or Firm*—Marsh Fischmann & Breyfogle

[57] ABSTRACT

A method and system for making monolithically integrated thin film photovoltaic is disclosed. In one embodiment of the system, a device for directing electromagnetic energy having a selected frequency is utilized to electronically excite a portion of a second medium on the surface of a substrate to facilitate reaction with an excitable deposition medium. The frequency may be selected such that the desired reaction between the excited second medium and deposition medium is facilitated and side reactions and incorporation of impurities into the thin film are minimized. Multiple layers may be formed by selecting additional frequencies, if necessary. The method of the present invention allows formation of monolithically integrated thin films without removing material from the substrate surface between deposition steps. In one embodiment, the method of the present invention includes the steps of providing a first excitable deposition medium, providing a substrate having a second medium positionable thereon, selecting a frequency of electromagnetic energy to excite the second medium, and directing electromagnetic energy having the selected frequency on at least a portion of the second medium to excite the medium to an excited state to facilitate a reaction with the excitable deposition medium, the product of such reaction being a first thin film deposit on the substrate.

19 Claims, 5 Drawing Sheets

ELECTROMAGNETIC BEAM ASSISTED DEPOSITION METHOD FOR DEPOSITING A MATERIAL ON AN IRRADIATED SUBSTRATE

FIELD OF THE INVENTION

The present invention relates to the field of thin film photovoltaics, and in particular to a system and associated method for making monolithically integrated thin film photovoltaics.

BACKGROUND OF THE INVENTION

Monolithically integrated thin films of conducting and semiconducting materials are used for a variety of applications requiring electronic networks. In manufacturing these thin film devices, multiple layers of differing compositions are typically deposited sequentially upon a substrate by various sputtering techniques, whereby atoms or molecules are removed from a solid target and form a gas or plasma comprising excited atoms or molecules in the vicinity of a substrate surface to form a thin film. In this regard, each layer of these thin films is typically deposited by bringing one or more species of atoms or molecules in contact with another species in or on the surface of a substrate by a sputtering technique to form a coating over the entire surface of the substrate.

Conventional manufacturing techniques for these multilayered devices require the deposition of films over the entire substrate surface, one layer at time. The coating is then removed, such as by mechanically scribing the surface where the film is to be removed or by ablation with a laser. In this regard, layers are each deposited as a film covering the entire surface and then selectively removed. Thus, numerous steps are required to manufacture these monolithically integrated films. Further, where it is desired to have different layers of films covering different portions of the surface, it is difficult to avoid removing a part of the lower layers as they are exposed during the selective removal of the last-deposited layer. In this regard, it is particularly difficult to produce high-quality monolithically integrated films over large substrate areas.

One application requiring high quality monolithically integrated networks is in photovoltaic devices used in spacecraft. These networks are deposited on relatively large sheets of substrate material, and they must be of high quality to perform efficiently over extended periods of time without maintenance. In particular, they must be substantially free of impurities, and defects and nonuniformities which can lead to degradation in performance.

SUMMARY OF THE INVENTION

Accordingly, it is an object of the present invention to provide a method for depositing and monolithically integrating thin films of conducting and semiconducting materials on at least a first, selected portion of a substrate.

It is a further object of the present invention to provide a method which requires fewer steps than previous processes and produces a high quality monolithically integrated product.

It is yet another object of the invention to provide a system that allows production of high quality monolithically integrated materials more rapidly and less expensively than with currently available methods.

In accordance with the above-noted objects, the present invention is directed to a method for depositing monolithically integrated thin films for electronic networks. Generally, the process includes the steps of providing a gaseous or plasma phase deposition medium in a first excited electronic state, providing a substrate with a second medium on the substrate surface, and directing a beam of electromagnetic radiation having a selected frequency onto a selected portion of the substrate surface, the frequency selected to correspond to an electronic transition between a ground state and a second excited electronic state in the second medium. As a result of directing the electromagnetic radiation having the selected frequency onto the selected portion of the substrate surface, the excited deposition medium and the excited second medium on the substrate surface undergo a chemical reaction at the substrate surface, resulting in the formation of a thin film deposit of a reaction product on the selected portion of the substrate surface. The method of the present invention results in an enhanced reaction rate between the two excited media relative to the reaction rate between the same media in unexcited states. The resulting thin film deposit is integrated with the surface and is substantially confined to the selected portion of the substrate surface which is irradiated with the electromagnetic radiation. This methodology may also be used for a liquid deposition media if the liquid is introduced into a vacuum, whereby the non-zero vapor pressure of the liquid will cause a gas to be present.

In one embodiment, the step of directing electromagnetic energy having the selected frequency (e.g., monochromatic radiation) includes the step of directing a laser beam having the selected frequency at the selected portion of the substrate. In this regard, a laser from which a laser beam is emittable at the selected frequency may be utilized to excite the second medium on the substrate surface to deposit the thin film. More specifically, for a given photon emitted from the laser at the selected frequency, the photon may strike one of the second medium atoms to pump a particular reaction, such that the excited atom of the second medium in the proximity of a potentially reacting (e.g., excited) deposition media atom have a high probability of becoming bonded, thereby facilitating deposition of the resulting thin film. In this regard, the step of directing electromagnetic energy or radiation having the selected frequency excites the second medium atoms on the selected portion of the substrate to an energy valence appropriate to facilitate deposition. In instances where a tunable means for directing electromagnetic radiation (e.g., tunable laser) is utilized, the directing step may further include the step of tuning such means to produce electromagnetic energy (e.g., a laser beam) having the selected frequency.

For purposes of producing or depositing a thin film on a preselected area of the substrate which is larger than the area of the directed electromagnetic radiation (e.g., laser spot) and/or producing a thin film in a selected pattern on the substrate, the directing step may include the steps of providing the appropriate second medium on the preselected area of the substrate or in a selected pattern and moving the preselected area of the substrate surface relative to the electromagnetic radiation directed thereon, such that substantially all of the preselected area of or pattern on the substrate is irradiated. In one embodiment, the directing step includes scanning the preselected area of the substrate surface with electromagnetic radiation to deposit the thin film on the preselected area of or in accordance with the preselected pattern on the substrate surface.

In another embodiment, the steps of providing a deposition medium and directing electromagnetic radiation at a selected portion of the substrate surface may be repeated with one or more different deposition media for the same selected area of the substrate or areas proximate or in overlapping relation to form a multi-layer monolithically integrated film. Thus, a different area of the substrate or of a previously deposited layer may be preselected for each layer of the film to be deposited in accordance with the method of the present invention, and each subsequent layer may at least partially overlap the previously deposited layer or layers. Of importance, material is not removed from the substrate surface by the electromagnetic radiation at the selected frequency (e.g., by the laser beam) during the process because the intensity of the radiation is low enough to avoid ablation or sputtering from the substrate surface.

In instances where the steps of providing a deposition medium and directing electromagnetic radiation are to be repeated to deposit a second layer which at least partially overlaps the first layer of deposited thin film, the step of directing the electromagnetic radiation at a selected frequency includes selecting a frequency corresponding to the energy required to excite at least the previously deposited layer (e.g., first layer) to a reactive, excited state. Further, the laser frequency used to form each layer can be selected to minimize the inclusion of impurities and defects in the thin film deposit and to minimize side reactions involving the excited deposition medium and/or the excited second medium. Thus, multiple layers may be deposited successively in accordance with the present invention, without the need to remove material mechanically from the substrate surface. The laser frequencies corresponding to electronic transitions in suitable media may generally be between about $1.5 \times 10^{11}$ Hz to about $1.5 \times 10^{13}$ Hz (e.g., ultraviolet, x-ray, microwave, optical, etc).

For purposes of facilitating and/or enhancing deposition, the method may further include the step of maintaining the deposition medium and substrate at selected, precisely known temperatures (e.g., at different temperatures or at the same temperatures). Further, the method may include the step of maintaining the substrate at a temperature low enough to prevent significant sputtering of the second medium from the substrate surface. The substrate temperature may be controlled independently of the temperature of the deposition medium by any suitable method known in the art.

The step of providing a deposition medium may include the step of providing the deposition medium in either a gaseous or a solid state. If the deposition medium is initially gaseous, the providing step may include exciting the deposition medium with electromagnetic energy or radiation (e.g., laser beam), using a frequency selected to facilitate the particular electron transition necessary to reach the excited state. If the deposition medium is originally in a solid state, the providing step may include exciting the solid deposition medium to a gaseous or plasma state in a sputtering process, thereby forming a plume of the excited deposition medium. The plume extends toward the substrate and may have a cross sectional area adjacent the substrate which is smaller than the area of the substrate surface. In this regard, the directing step may include moving the substrate relative to the plume to facilitate contact between the plume and all of the substrate surface.

In another aspect, the present invention comprises a system which may be used to simultaneously deposit and integrate monolithic thin films for electronic networks. The system includes an enclosure capable of maintaining a controlled atmosphere and enclosing a deposition medium and a substrate therein, the deposition medium being excitable to a first reactive electronic state and the substrate having a surface comprising a second medium excitable to a second reactive state, and means for directing monochromatic electromagnetic energy or radiation having a selected frequency at a selected portion of the substrate to excite the second medium to the second reactive state. The radiation is incidentable upon the selected portion of the substrate surface to excite the second medium to the second reactive state, which is reactive with the deposition medium in the first reactive electronic state to form a thin film of a reaction product on the substrate.

In a preferred embodiment, the means for directing monochromatic electromagnetic radiation comprises a means for producing a laser beam having a selected frequency, such frequency corresponding to an electronic transition between a ground state and a second excited electronic state in the second medium. In this regard, the means for producing a laser beam includes a laser which is capable of focussing a laser beam on a selected location of the substrate at a selected frequency. Use of such a laser having an extremely fine beam which is focussed only on a selected location of the substrate permits the selection of regions of the substrate which will have deposited thereon the thin film and others which will not, and monolithic regions which will contain the deposits and other which will not, and monolithic integration without the removal of material after deposition is facilitated. In one embodiment, the means for producing a laser beam comprises a tunable laser means for producing a laser beam of the selected frequency regime (e.g., ultraviolet, x-ray, microwave, optical, etc), such laser beam being incidentable upon a selected portion (e.g., selected spatial location) of the substrate surface. The tunable laser means may comprise a single tunable laser, or it may comprise a plurality of tunable lasers, with each tunable laser being operative over a different range of frequencies and/or different areas of the substrate.

In another embodiment, the system further includes a means for moving the means for producing electromagnetic radiation having a selected frequency relative to the substrate. In this regard, the system is capable of depositing a thin film on the substrate surface over a selected spatial area which is larger than the area of the beam produced by the electromagnetic radiation and/or depositing a thin film on the substrate surface in a selected pattern. For example, in instances where the means for producing electromagnetic radiation comprises a laser for producing a finely focused laser beam, the means for moving may scan a selected area of the substrate surface which is larger than the selected portion of the surface on which the beam is incident.

The deposition medium may be gaseous or in a solid state. In instances where material to be deposited is in a gaseous state, the system may include a means for exciting the gaseous deposition medium. In one embodiment, the deposition medium may be heated to an appropriate temperature or excited with an additional laser beam having an appropriate frequency. Alternatively, in instances where the deposition medium is in a solid state, the system further includes a sputtering means for exciting at least a part of the solid source to form a plume of sputtered material in the first reactive state. The sputtering means may be located outside the enclosure or, alternatively, may be positioned within the enclosure. The plume formable by such sputtering means may extend to the substrate surface. Adjacent the substrate surface, the plume has a cross sectional area which may be smaller than the substrate surface area. If needed, the system may further include a means for moving the substrate relative to the solid source to allow contact between the plume and a larger area or all of the substrate surface. In a preferred embodiment, the sputtering means comprises a laser device or an electron beam device. In instances where a plurality of deposition media are positionable within the enclosure, the sputtering means may be operative to excite all of the deposition media.

In accordance with the present invention, the monolithically integrated thin film resulting from the above-summarized process using the above-summarized system may include at least one layer of $CuInSe_2$ for use in photovoltaic devices. Heretofore, $CuInSe_2$ films commonly comprised impurities such, as $SeO_2$ and $SeO_3$, which can degrade the performance of the photovoltaic devices. It is believed that $CdInSe_2$ films prepared in accordance with the present invention will have fewer defects and impurities, and thus will have higher photovoltaic efficiency.

DETAILED DESCRIPTION OF THE INVENTION

It is increasingly desirable to produce electronic devices with more densely packed circuits while obtaining improved circuit performance. In particular, films for use in remote locations, such as spacecraft, must perform reliably for extended periods of time without maintenance. However, both dense packing of circuits and increased performance demands require that the monolithically integrated thin films within these devices are of high quality, with few defects and impurities. At the same time, each film layer must be precisely located on the substrate, with well-defined edges.

The present invention is based on the recognition that it is possible to control the reaction between a deposition medium and a substrate surface medium by carefully controlling the level of electronic excitation of the substrate surface medium and, preferably, also the deposition medium, to optimize a chemical reaction between the two media while simultaneously controlling the specific location on the substrate surface where the desired reaction occurs. As a result of the improved control over the reaction, high quality monolithically integrated thin films can be manufactured on selected portions of the substrate using fewer processing steps than has hitherto been possible.

The monolithically integrated thin films of the present invention may be used in electronic devices, such as solar cells. Generally, the thin films comprise multiple layers, each of which is deposited over a portion of the surface of a substrate. Individual layers may at least partially overlap other layers, but generally, not all of the layers cover the same portion of the substrate surface. Individual layer thicknesses are generally between about 0.1 microns and about 10 microns. Each layer may have different electrical properties, with some layers being conductors, others insulators, and others semiconductors.

One aspect of the invention concerns a system for depositing monolithically integrated thin films on a substrate. The system facilitates precise control of a chemical reaction between a deposition medium and a second medium at the substrate surface while reducing the number of steps required to manufacture the thin films. Another aspect of the present invention concerns a method for depositing monolithically integrated thin films.

Figure 1:
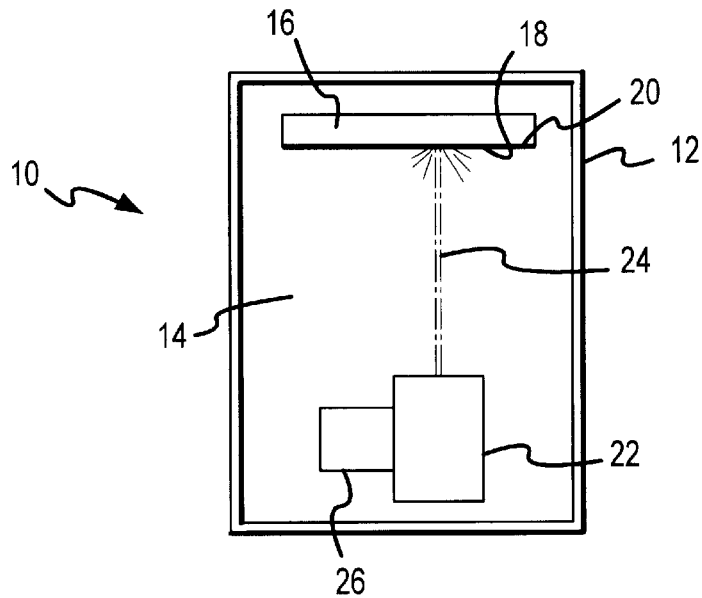
FIG. 1 is a schematic drawing of one embodiment of the system of the present invention.

A system for making monolithically integrated thin films in accordance with the present invention is shown generally as 10 in FIG. 1. The system 10 includes an enclosure 12 which is capable of maintaining a controlled atmosphere in accordance with the requirements for the particular materials and reactions to be conducted inside the enclosure. In this regard, the enclosure 12 is sealed from the ambient atmosphere, and a gaseous deposition medium 14 is introduced into the enclosure 12, wherein the gaseous deposition medium 14 is maintainable at a precise temperature and pressure selected to optimize a chemical reaction between deposition medium 14 and a second medium 18 on a substrate surface 20, which is also positionable within the enclosure 12. For example, it may be necessary to conduct some reactions at low pressure, at controlled or selected temperatures and/or in the presence or absence of particular gases. As such, the enclosure 12 may be equipped with suitable heating devices, cooling devices, valves, pressure regulators, vacuum pumps, and other mechanisms, as needed, to introduce and maintain a gaseous deposition medium 14 at a predetermined precise temperature and pressure in the enclosure 12. In this regard, the temperature, pressure, and composition, as needed for the specific reactants and chemical reaction or reactions taking place, may be selected. For example, it may be necessary to exclude one or more common ambient atmospheric gases, such as oxygen, or it may be necessary to maintain the atmosphere inside the enclosure at a pressure other than ambient atmospheric pressure. Further, it may be necessary to maintain the temperature of at least one of the deposition medium and substrate to facilitate the desired reactions within the enclosure. The enclosure should be made from one or more materials which do not interfere with the desired reactions to be conducted inside the enclosure and which can withstand the desired reaction conditions. In this regard, the temperature, pressure, and composition, as needed for the specific reactants and chemical reaction or reactions taking place, may be selected. For example, it may be necessary to exclude one or more common ambient atmospheric gases, such as oxygen, or it may be necessary to maintain the atmosphere inside the enclosure at a pressure other than ambient atmospheric pressure. Further, it may be necessary to maintain the temperature of at least one of the deposition medium and substrate to facilitate the desired reactions within the enclosure. The enclosure should be made from one or more materials which do not interfere with the desired reactions to be conducted inside the enclosure and which can withstand the desired reaction conditions.

In one embodiment, the deposition medium 14 positionable within the enclosure 12 comprises a suitable gaseous material or a solid material capable of excitation to form a suitable gas or plasma phase reactant. For instance, the deposition media can include Si, Ge, Se, In, or typical II–IV semiconducting compounds. A substrate 16 is also positionable within the enclosure 12, and a second medium 18 is positionable on the surface 20 of the substrate 16. The overall substrate 16 may comprise a glasseous substrate or a polyimide sheet in view of its stable thermal properties, relatively high strength, initially smooth surface and suitability to space environments, and the second medium 18 may comprise any solid material capable of reacting with the deposition medium 14 to form a conductive, semiconductive, or insulating material, as desired.

For purposes of exciting at least a selected portion of the second medium 18 on the substrate 16, such that atoms in the selection portion of the second medium 18 are excited to an energy valence to facilitate deposition, the system 10 includes a tunable laser device 22 capable of emitting electromagnetic radiation having a selected frequency, the laser device 22 being positionable in the enclosure 12. The laser device 22 is thus capable of producing a laser beam 24 which is incidentable on substrate surface 20. The laser beam 24 can be extremely fine and focused on only a selected location on the substrate surface 20, and has a laser frequency selected to excite the radiated portion of the second medium 18 to a desired reactive electronic state while side reactions involving one or more of the excited species and formation of impurities in the thin film are minimized. In this regard, the system of the present invention functions to excite the second medium 18 on the substrate surface 20 only where the laser beam 24 is incident on surface 20, such that any reaction between the excited deposition medium 14 and the excited second medium 18 on the substrate surface 20 is substantially restricted to the scanned or radiated areas of substrate surface 20. The intensity of the laser beam 24 is low enough that substantially no material is removed from the substrate surface 20, and the substrate 16 is not heated significantly.

In one embodiment of the present invention, laser device 22 is a tunable laser which may provide a laser beam 24 which has a frequency selected to optimize excitation of second medium 18 on substrate surface 20. In this regard, upon excitation of the selected area of the second medium 18 by the laser beam 24 having the selected frequency, the excited second medium 18 and excited deposition medium 14 react to form a thin film deposit of a reaction product on the substrate surface 20, in the area radiated by the laser beam 24 (e.g., the selected area of the second medium 18). Tunable lasers of various frequency regimes are commercially available from a variety of vendors. Of course, the laser device 22 may be positioned outside of the enclosure 12, whereby the laser beam emitted from such laser device 22 can enter the enclosure 12 via a window (to be described in more detail hereinbelow).

In a preferred embodiment, the system 10 further includes a scanning means to enable the laser beam 24 to move relative to substrate surface 20, such that a selected area of the surface of the substrate 16 is radiated. A scanning means 26 functions to move the laser beam 24 relative to the substrate surface 20 so as to scan a selected area on the substrate surface 20 and/or to scan the substrate surface 20 in accordance with a predetermined pattern. In this regard, the scanning means is especially use in instances where the area of the thin film to be deposited is greater than the spot of the laser beam 24 emitted from the laser device 22 and/or where the thin film is to be deposited in accordance with a predetermined pattern. The scanning means 26 can be any means known in the art for moving a laser beam with respect to a surface to be scanned.

Figure 2:
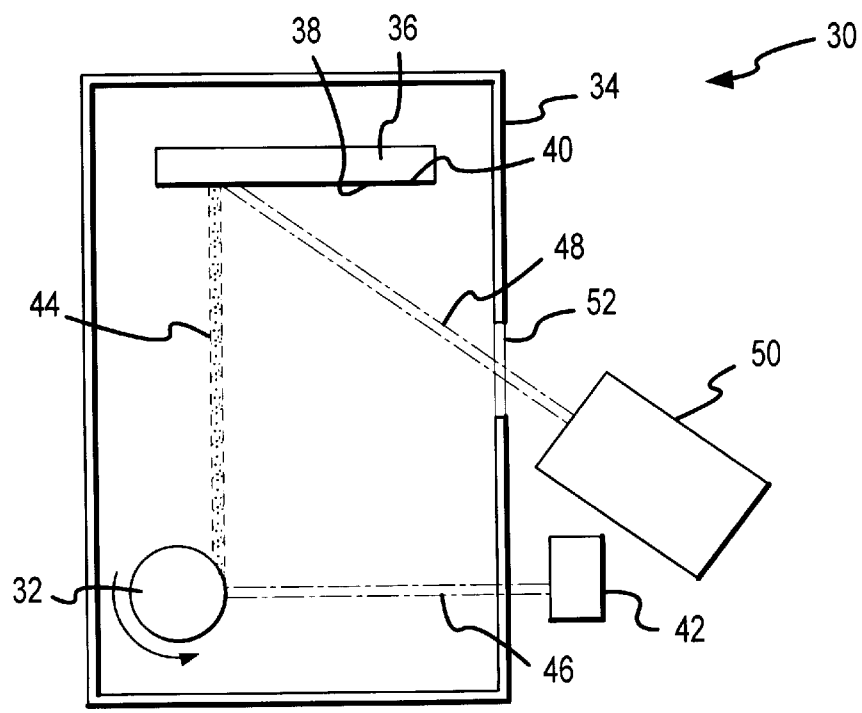
FIG. 2 is a schematic drawing of another embodiment of the system of the present invention.

Referring to FIG. 2, in another embodiment of the system of the present invention, a system 30 functions to deposit monolithically integrated thin films on a substrate. The system 30 is especially useful in instances where a solid deposition medium is utilized. In this embodiment, the system 30 includes an enclosure 34 for enclosing therein a solid deposition medium source 32 and a substrate 36, the substrate 36 having a second medium 38 positionable on the substrate surface 40. The second medium 38 is positionable to generally face toward the solid deposition medium source 32. In order to excite the solid deposition medium source 32, such that at least a portion of any excited deposition medium from the solid deposition medium source 32 contacts the second medium 38 on the substrate surface 40 to facilitate a reaction with an excitable second medium 38, the system 30 further includes a sputtering system 42 for sputtering material from the solid deposition medium source 32 to form a plume 44 of the deposition medium, such plume 44 of the deposition medium being in an excited gaseous or plasma state. In this embodiment, the sputtering system 42 is capable of producing an incoming beam 46, such as an electron or laser beam, which is incidentable upon the solid deposition medium source 32. Further, the system 30 includes a means to rotate the solid deposition medium source 32 for imparting a predetermined velocity to the excited deposition material sputtered into the plume 44. The direction of rotation of the solid deposition medium source 32 is indicated by the arrow. The resulting plume 44 extends at least toward the substrate surface 40, and adjacent the substrate surface 40, the plume 44 has a cross sectional area which is smaller than the area of the surface 40.

For purposes of exciting the second medium 38, the system 30 further includes a laser beam 48 capable of emitting a tunable laser 50. In this embodiment, the tunable laser 50 is positioned outside of the enclosure 34 such that the laser beam 48 from the laser 50 passes through a window 52 which is substantially transparent to the laser beam 48 and is incidentable on a portion of the substrate surface 40 to excite the second medium 38 to thereby initiate a chemical reaction between the excited deposition medium of the plume 44 and the excited second medium 38, the product of which forms a thin film bonded to the substrate surface 40. The system 30 may also include one or more lenses and/or passive and/or active (e.g., steerable) mirrors to direct the laser beam 48 as desired. Of course, the laser device 50 may be positioned within the enclosure 34, substantially as described hereinabove with respect to another embodiment of the present invention. In addition, the sputtering system may be positioned outside of the enclosure, whereby an electron or laser beam from the sputtering system can enter the enclosure via an appropriate window.

The system 30 may further include a means (not shown) for moving the laser beam 48 relative to the substrate surface 40 so as to scan the substrate surface 40 over a predetermined area and/or pattern. There may be an additional means (not shown) to move the substrate 36 relative to the solid source 32 and the plume 44 to facilitate contact of the plume 44 with a larger area of the substrate surface 40. The predetermined velocity of the deposition medium in the plume 44 is selected so that the deposition medium is excited to a state which facilitates reaction between the sputtered, excited deposition medium in the plume 44 and the second medium on the substrate surface 40 which has been excited by the laser beam 48.

Figure 3:
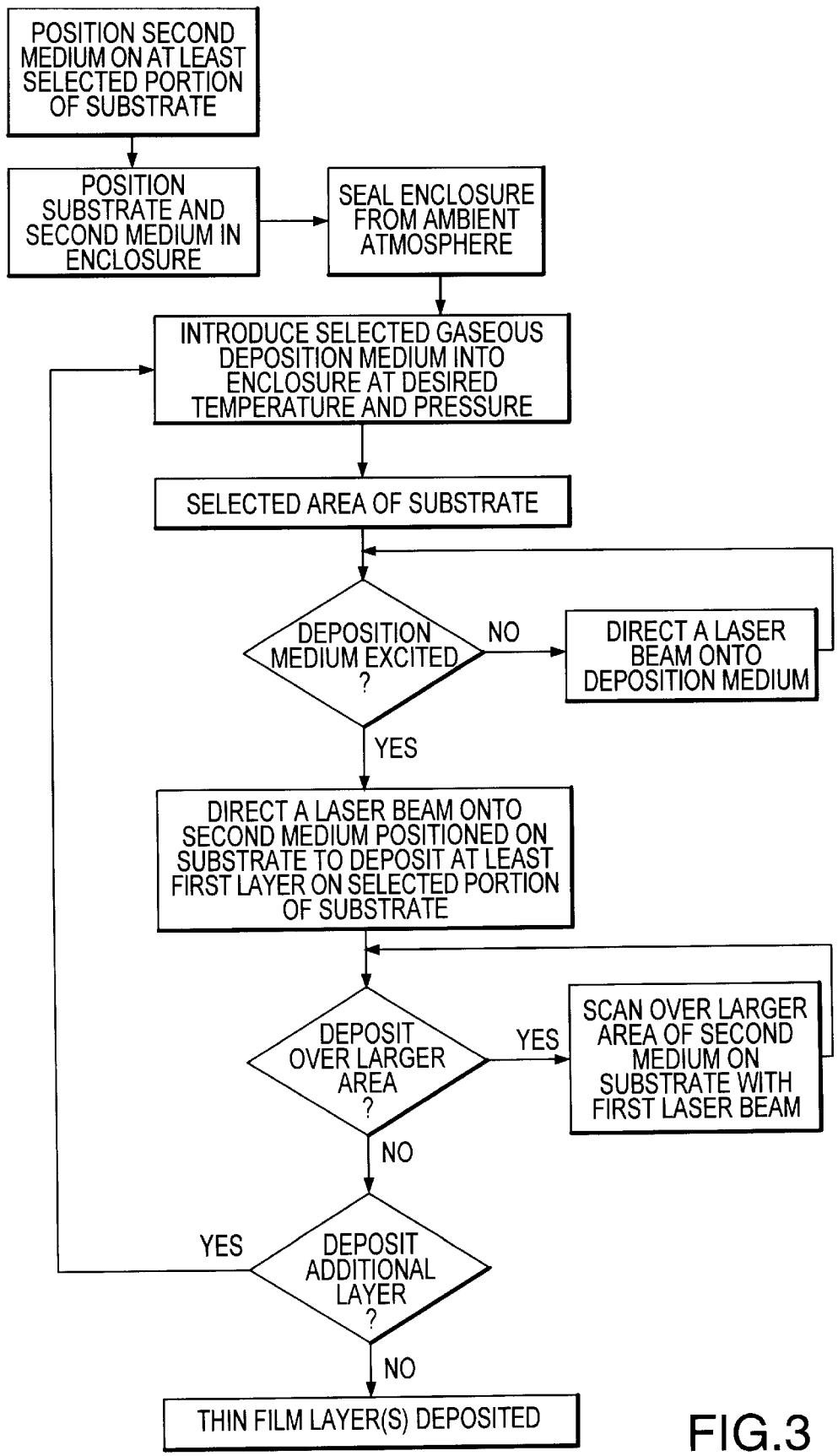
FIG. 3 is a flow chart showing one embodiment of the method of the present invention.

In another aspect, the present invention is directed to a method for depositing thin films. The method is more specifically directed to depositing monolithically integrated thin films, shown schematically in FIG. 3. Initially, the method includes the step of positioning within an enclosure a suitable substrate having a second medium positioned on at least a portion of its surface and sealing the enclosure from the ambient atmosphere. The second medium may be positioned on a selected portion or area of the substrate surface, the selected portion or area corresponding to the area of the substrate surface on which the thin film layer is to be deposited. For purposes of providing a deposition media to be deposited on the substrate in accordance with the present invention, the method further includes introducing one of a gaseous deposition medium and a deposition medium in a solid state into the enclosure at a desired temperature and pressure. In instances where a gaseous deposition medium is introduced into the enclosure, the temperature and pressure may be selected to excite a large enough population of the gaseous deposition medium to a desired excited electronic state to facilitate a desired chemical reaction between the excited deposition medium and the excitable second medium on the substrate surface. The method of the present invention may further include an optional step of further exciting the deposition medium with a second laser beam having a frequency selected to optimize the population of the gas molecules in an excited electronic state. Of importance, in order to facilitate deposition, the method further includes the step of directing a first laser beam from a first laser at a selected frequency upon a selected portion of the substrate to excite the second medium, whereby a reaction between the excited deposition and the excited second medium on the substrate results to form a thin film deposit on the substrate. In another optional step, the substrate surface may be scanned with the first laser beam to cover a larger area of the surface and/or to form a thin film deposit on the substrate in accordance with a predetermined pattern. The process can be repeated as desired to deposit additional thin film layers on the substrate and/or previously deposited layers, the additional thin film layers being of the same or different materials, depending upon the deposition media and/or second media selected.

Figure 4A:
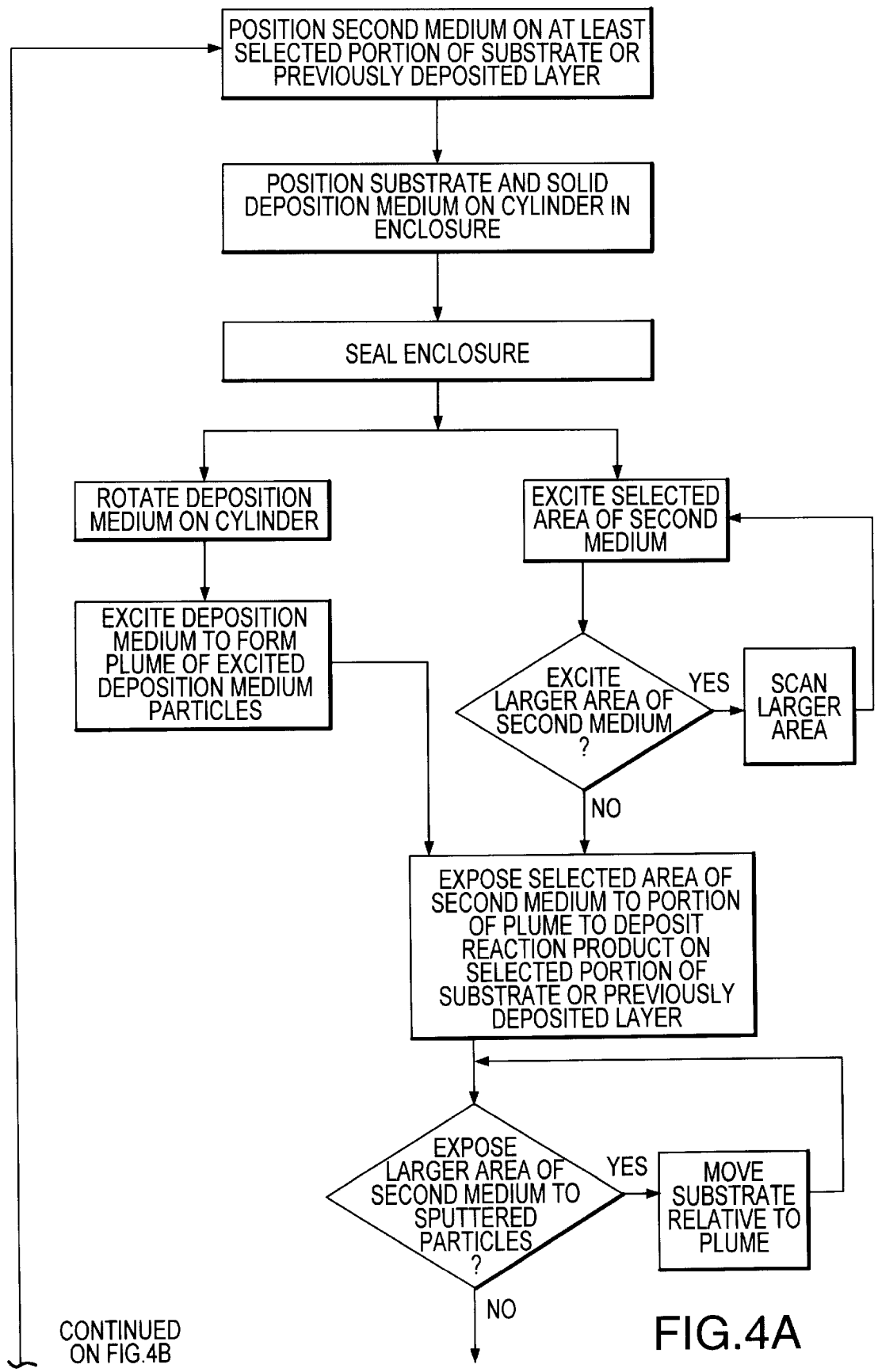
FIGS. 4A and 4B are a flow chart showing another embodiment of the method of the present invention.
Figure 4B:
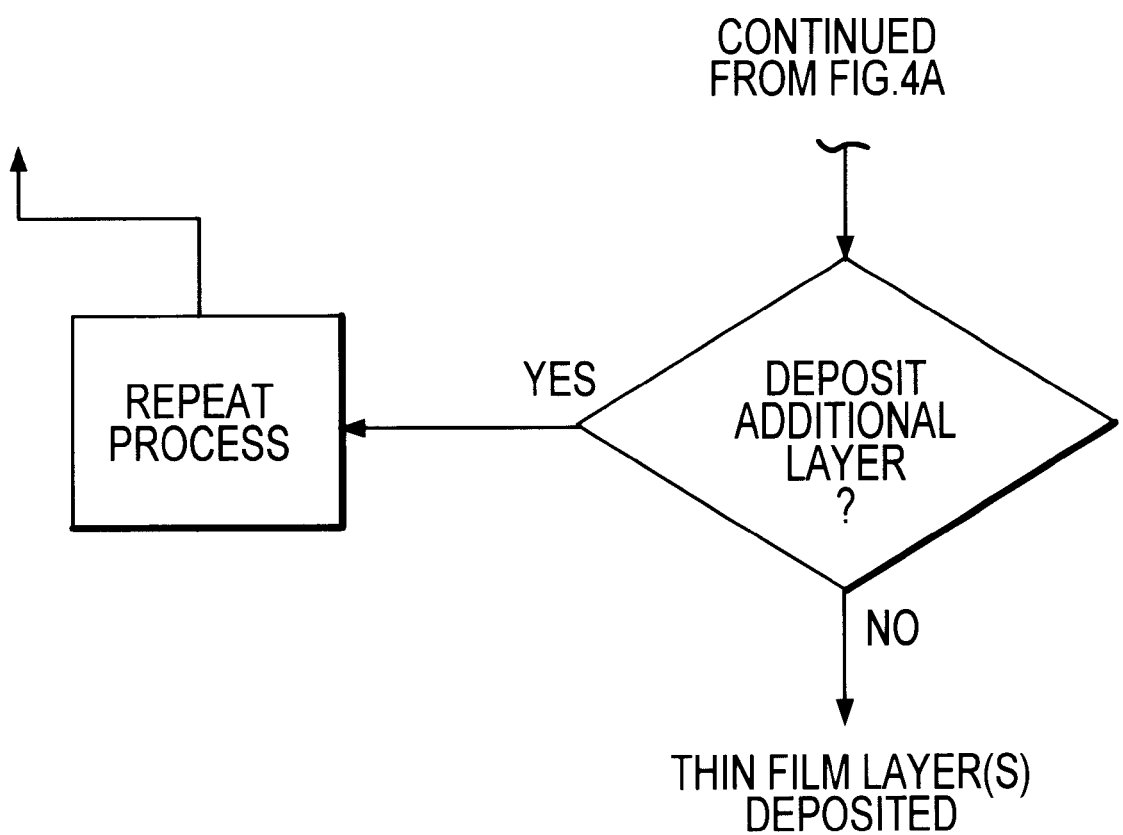

Another embodiment of the method of the present invention is shown generally in FIGS. 4A–4B. Initially, the method includes the step of positioning a substrate and a solid deposition medium source in an enclosure, the substrate having a second medium positioned on a surface of the substrate in a selected area on which the thin film is to be deposited. The method further includes the step of sealing the enclosure from the ambient atmosphere and then filled with a suitable atmosphere to enhance the forthcoming reaction.

In order to facilitate the formation of a thin film on the substrate, the method further includes directing a laser beam emitted from a laser device at the selected area of the substrate to excite the second medium, and exposing the excited second medium on the selected area of the substrate to particles of excited deposition. In one embodiment, the exposing step includes the steps of exciting a solid deposition medium by a sputtering technique to form particles of excited deposition media and directing the excited particles of deposition media towards the excited second medium on the selected area of the substrate. In one embodiment, the step of directing the excited particles of the deposition medium includes rotating the solid deposition medium during the exciting step, such that a plume of excited particles of the deposition medium forms which extends at least towards the second medium being radiated by the laser beam at a selected frequency. The velocity of the excited particles being propelled towards the substrate is dependent upon the rotation of the solid deposition medium. As a result, a chemical reaction between the excited deposition media and the excited second medium occurs, resulting in the formation of a reaction product (e.g., thin film) bonded to the substrate surface.

The method may further include the step of moving the substrate relative to the solid deposition medium source, such that a thin film can be deposited on a selected portion or pattern on the substrate. In this regard, the substrate may be moved relative to the solid source to increase the substrate area which is exposed to the plume of excited deposition media. Further, the process may be repeated with the same or different deposition media and substrate surface materials (e.g., second medium), using appropriately selected sputtering conditions and laser frequencies, to deposit additional layers of thin film on different portions of the substrate and/or on previously deposited layers.

This embodiment can be understood more specifically with reference to FIG. 2, which illustrates the above-described system 30. The sputtering beam 46 is capable of removing at least some of the solid deposition medium from the solid source 32 to form the plume 44. The rotational velocity of the solid source 32 and the energy of the beam 46 are selected so that the deposition medium in the plume 44 is excited to an optimum state for reaction with the second medium 33 on the substrate surface 40, the excited deposition medium of the plume 44 extending to the substrate surface 40. As described above with reference to FIG. 1, the laser frequency of the laser beam 48 is selected to excite some of the molecules or atoms in the layer of the second medium 38 on the substrate surface 40 to an excited electronic state such that the desired chemical reaction between the excited deposition medium and the excited second medium is optimized.

In the method of the present invention, the deposition of each layer is carefully controlled so that high-quality material is placed only in the locations where it is desired on the substrate surface, and it is unnecessary to remove material from areas on the substrate after deposition. Thus, there is much less likelihood of damage to film layers than with prior methods, where material must be selectively removed after deposition. Also, construction of monolithically integrated devices is greatly simplified and requires fewer steps than with prior methods.

In the present invention, the laser beam can be pulsed or continuous. The use of a tunable laser allows selection of the precise frequency which will excite the second medium and facilitate the desired chemical reaction. Precise selection of the laser frequency minimizes both side reactions and the incorporation of impurities in the film formed by the desired chemical reaction. One or more subsequent film layers having a different composition can be deposited by changing at least one of the laser frequency, the atmospheric conditions in the enclosure, the deposition medium, and, if one or more solid sources are used for the deposition medium, the sputtering conditions. It may be necessary to utilize more than one tunable laser to obtain all of the selected frequencies. The laser frequencies are preferably in the near ultraviolet range.

The method of the present invention can be repeated one or more times to deposit multiple layers on the substrate or on a previously deposited layer of thin film, and the scanning pattern for the laser beam may be changed for deposition of each layer. The rate of scanning is selected so that the laser beam remains on each spot of the scanned area for a time period which results in deposition of a thin film having the desired thickness. The intensity of the laser beam and the scan rate can be adjusted to provide the proper film thickness without heating the substrate so much that control of the reaction is decreased or material is removed by the laser from the substrate surface. The scanning may be accomplished by any means known in the art, such as with a computer-controlled scanning device which moves either the laser beam or the substrate or both.

Figure 5:
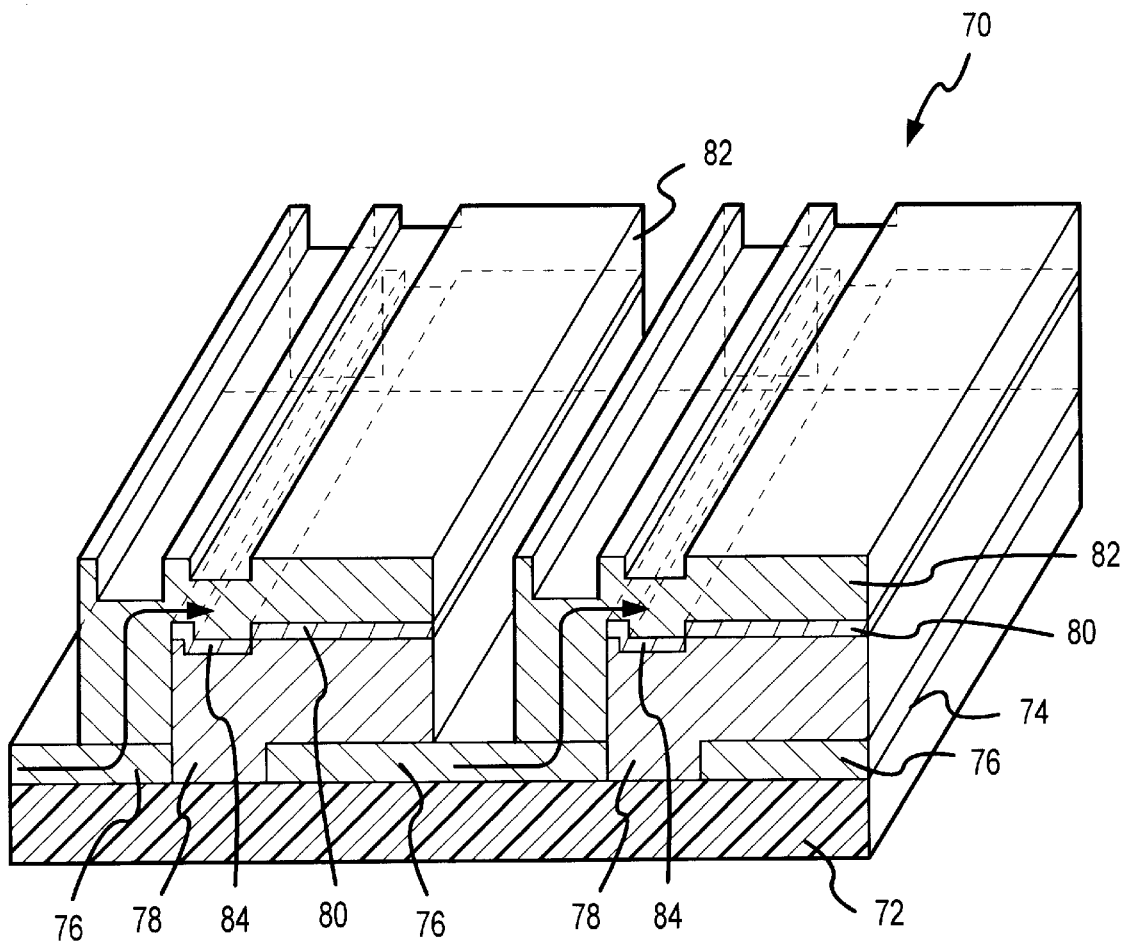
FIG. 5 is a block diagram of a portion of a monolithically integrated thin film such as the thin films of the present invention.

In accordance with the method and system of the present invention, thin film layers of the same and/or different compositions may be deposited side by side and/or may completely or partially overlap another thin film layer. As shown in FIG. 5, a monolithically integrated thin film 70, made in accordance with the system and method of the present invention and suitable for use in photovoltaic devices, has been deposited on the substrate 72, along with other subsequently deposited thin films. In this resulting product, various layers comprising the thin film 70 have been deposited on the substrate 72 having a surface 74. The substrate 72 may comprise any suitable material for the specific application in which the device will be used. For example, the substrate 72 may comprise a sheet of a thin, plastic material, such as a polyimide film or a more rigid sodalime glass sheet coated with molybdenum, both of which are suitable for use in a solar cell. A conductive coating 76 (e.g., second medium) covers most of the substrate surface 74. In a preferred embodiment, the conductive coating 76 comprises molybdenum. In accordance with the principles of the present invention, the monolithically integrated thin film 70 includes a first deposited layer 78 which has been deposited on the substrate 72. In this regard, the portion of the substrate surface 74 which is not covered by the conductive coating 76 is covered by a first deposited layer 78 of a first semiconducting material, such as p-type $CuInSe_2$, which also covers part of the conductive coating 76. In order to obtain the first deposited layer 78 of this particular material, the deposition medium comprises copper followed by indium which can be selenized between about 250° C. and about 450° C. to produce $CuInSe_2$ in a $H_2Se$ rich atmosphere using a laser of the correct frequency. A second semiconducting layer 80 has also been deposited over first layer 78. The second semiconducting layer 80 may comprise an n-type semiconductor, such as CdS. In order to obtain the second deposited semiconducting layer 80 of this particular material, the deposition medium comprises CdS. The materials in the first and second layers 78 and 80 are selected to provide desired band gaps and junctions. A third semiconducting layer 82 deposited in accordance with the present invention comprises an n-type semiconductor, such as ZnO:Al and is deposited over second semiconducting layer 80 and over a portion of conductive layer 76 which has not been overlaid with first and second semiconducting layers 78 and 80. In order to obtain the third deposited semiconducting layer 80 of this particular material, the deposition medium comprises ZnO. The structure shown in FIG. 5 can be part of a larger network. For example, substrate sheets as large as twelve inches (30.5cm) square may be linked together in some applications, such as solar cells for spacecraft.

The foregoing description of the present invention has been presented for purposes of illustration and description. Furthermore, the description is not intended to limit the invention to the form disclosed herein. Consequently, variations and modifications commensurate with the above teachings and with the skill or knowledge of the relevant art are within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A method for depositing monolithically integrated thin films for electronic networks, the method comprising the steps of:

disposing a first deposition medium in proximity to a substrate medium, wherein said second medium is disposed on at least a portion of a first surface of a substrate;

directing electromagnetic energy at a first frequency toward only a first selected portion of said first selected portion, wherein said first frequency is within a first range of about $1.5 \times 10^{11}$ hertz to about $1.5 \times 10^{13}$ hertz, and wherein said first frequency is selected based upon said substrate medium; and reacting said first deposition medium with said substrate medium on which said electromagnetic energy from said directing step is incident thereon, wherein said reacting said first deposition medium step forms a first thin film deposit on said substrate.

2. A method as claimed in claim 1, wherein said directing step comprises directing a first laser beam from a first laser device toward said substrate.

3. A method as claimed in claim 1, further comprising the step of:

tuning a first tunable laser device to said first frequency, wherein a first laser beam emitted from said first tunable laser is at said first frequency as a result of said tuning step, wherein said directing step comprises using said first laser beam.

4. A method as claimed in claim 1, further comprising the step of:

providing a pattern of said substrate medium on said first surface of said substrate, wherein said directing step comprises scanning said electromagnetic energy so as to follow said pattern.

5. A method as claimed in claim 1, further comprising the steps of:

disposing a second deposition medium in proximity to said first thin film deposit, wherein said first and second deposition mediums are of different compositions;

directing electromagnetic energy at a second frequency toward only a second selected portion of said first surface of said substrate, wherein at least a portion of said first thin film deposit coincides with said second selected portion, and wherein said second frequency is within said first range; and reacting said second deposition medium with said first thin film deposit on which said electromagnetic energy at said second frequency from said directing step is incident thereon, wherein said reacting said second deposition medium step forms a second thin film deposit on at least part of said first thin film deposit.

6. A method as claimed in claim 1, further comprising the steps of:

disposing a substrate deposition medium in proximity to said second medium, wherein said first and second deposition mediums are of different compositions;

directing electromagnetic energy at a second frequency toward only a second selected portion of said first surface of said substrate, wherein at least a portion of said substrate medium is coincident with said second selected portion, wherein said second frequency is within said first range, and wherein said first and second selected portions are disposed in side by side relation; and reacting said second deposition medium with said substrate medium on which said electromagnetic energy at said second frequency from said directing step is incident thereon, wherein said reacting said second deposition medium step forms a second thin film deposit on said substrate.

7. A method as claimed in claim 1, wherein said directing step does not significantly heat said substrate.

8. A method as claimed in claim 1, further comprising the step of optimizing excitation of atoms of said substrate medium to an energy valence so as to facilitate deposition of said first thin film deposit on said substrate, wherein said optimizing step comprises using said first frequency.

9. A method as claimed in claim 1, wherein said first thin film deposit comprises $CuInSe_2$.

10. A method as claimed in claim 1, wherein said first deposition medium is in a solid phase, and wherein said method further comprises the step of exciting said first deposition medium.

11. A method as claimed in claim 10, wherein said exciting said first deposition medium step comprises the step of sputtering said first deposition medium.

12. A method as claimed in claim 1, further comprising the steps of:

forming a second thin film deposit on at least one of said first thin film deposit and said substrate, wherein said first and second thin film deposits are of different compositions.

13. A method as claimed in claim 12, wherein said forming a second thin film deposit step comprises at least one of disposing a second deposition medium in proximity to an area where said forming a second thin film step is to be executed and directing electromagnetic energy at a second frequency toward said area where said forming a second thin film deposit step is to be executed, wherein said first and second deposition mediums are of different compositions, and wherein said first and second frequencies are of different magnitudes.

14. A method as claimed in claim 1, wherein only a portion of said first deposition medium participates in said reacting step.

15. A method as claimed in claim 1, wherein said first deposition medium is initially in a gaseous state.

16. A method as claimed in claim 1, further comprising the step of:

maintaining said first deposition medium and at least one of said substrate and said substrate medium at substantially the same temperature.

17. A method, as claimed in claim 1, wherein:

said electromagnetic energy from said directing step covers only a spot on said substrate medium in relation to said first surface of said substrate.

18. A method as claimed in claim 1, further comprising step of:

moving said substrate relative to said electromagnetic energy so as to have said electromagnetic energy be incident on a second selected portion of said substrate median which is spatially disposed from said first selected portion.

19. A method for depositing a thin film, comprising the steps of:

disposing a first deposition medium in proximity to a substrate medium, wherein said second medium is disposed on at least a portion of a first surface of a substrate;

directing electromagnetic energy at a first frequency toward a first selected portion of said first surface of said substrate, wherein at least a portion of said substrate medium coincides with said first selected portion, wherein said first frequency is selected so as to raise an energy of said substrate medium to a level to facilitate deposition without significantly heating said substrate; and reacting said first deposition medium with said substrate medium on which said electromagnetic energy from said directing step is incident thereon, wherein said reacting said first deposition medium step forms a first thin film deposit on said substrate.

* * * * *

UNITED STATES PATENT AND TRADEMARK OFFICE
CERTIFICATE OF CORRECTION

PATENT NO. : 6,113,751
DATED : September 5, 2000
INVENTOR(S) : MORGENTHALER

It is certified that error appears in the above-identified patent and that said Letters Patent are hereby corrected as shown below:

At Column 12, line 6, after the word "of" insert therefor --said first-surface of said substrate, wherein at least a portion of said second medium coincides with--;

At Column 14, line 15, please delete the word "median" and insert therefor --medium--.

Signed and Sealed this

Twenty-fourth Day of April, 2001

Attest:

NICHOLAS P. GODICI

Attesting Officer

Acting Director of the United States Patent and Trademark Office